United States Patent
Dzurak et al.

(10) Patent No.: US 9,886,668 B2
(45) Date of Patent: Feb. 6, 2018

(54) ADVANCED PROCESSING APPARATUS

(71) Applicant: NEWSOUTH INNOVATIONS PTY LIMITED, New South Wales (AU)

(72) Inventors: Andrew Dzurak, Elizabeth Bay (AU); Menno Veldhorst, Bergschenhoek (NL); Chih-Hwan Henry Yang, Ashfield (AU)

(73) Assignee: NEWSOUTH INNOVATIONS PTY LIMITED, Sydney, New South Wales (AU)

( * ) Notice: Subject to any disclaimer, the term of this patent is extended or adjusted under 35 U.S.C. 154(b) by 0 days.

(21) Appl. No.: 15/316,713

(22) PCT Filed: Jun. 6, 2014

(86) PCT No.: PCT/AU2014/000596
§ 371 (c)(1),
(2) Date: Dec. 6, 2016

(87) PCT Pub. No.: WO2015/184484
PCT Pub. Date: Dec. 10, 2015

(65) Prior Publication Data
US 2017/0147939 A1    May 25, 2017

(51) Int. Cl.
*H03K 19/195*     (2006.01)
*G06N 99/00*      (2010.01)
*H01L 29/66*      (2006.01)
*B82Y 10/00*      (2011.01)

(52) U.S. Cl.
CPC ..... *G06N 99/002* (2013.01); *H01L 29/66977* (2013.01); *H03K 19/195* (2013.01); *B82Y 10/00* (2013.01); *Y10S 977/943* (2013.01)

(58) Field of Classification Search
CPC .... H03K 19/195; B82Y 10/00; H01L 49/006; H01L 29/66977; G06N 99/002; Y10S 977/943
USPC .......................................................... 326/2
See application file for complete search history.

(56) References Cited

U.S. PATENT DOCUMENTS

| 7,405,423 B2* | 7/2008 | Tanamoto | B82Y 10/00 |
| | | | 257/48 |
| 2007/0063182 A1* | 3/2007 | Yang | B82Y 10/00 |
| | | | 257/14 |
| 2008/0237576 A1* | 10/2008 | Hawrylak | B82Y 10/00 |
| | | | 257/24 |
| 2011/0085381 A1* | 4/2011 | Ferrus | H01L 21/28273 |
| | | | 365/185.18 |

(Continued)

OTHER PUBLICATIONS

International Search Report for Application No. PCT/AU2014/000596 dated Jul. 30, 2014 (3 pages).

(Continued)

*Primary Examiner* — Don Le
(74) *Attorney, Agent, or Firm* — Michael Best & Friedrich LLP

(57) ABSTRACT

A processing element for an advanced processing apparatus. The processing element comprises a silicon-insulator interface and a confining arrangement for confining one or more quantum dots in the semiconductor. The processing element has also a control arrangement for controlling a quantum property of the one or more quantum dots and operate the one or more quantum dots as a qubit to perform quantum processing.

21 Claims, 12 Drawing Sheets

(56) References Cited

U.S. PATENT DOCUMENTS

2016/0275410 A1* 9/2016 Rogge .................... B82Y 10/00

OTHER PUBLICATIONS

Written Opinion for Application No. PCT/AU2014/000596 dated Jul. 30, 2014 (5 pages).
Hao, Xiaojie, et al. "Electron spin resonance and spin-valley physics in a silicon double quantum dot." Nature communications 5, May 14, 2014, pp. 1-8.
Maune, B.M., et al. "Coherent singlet-triplet oscillations in a silicon-based double quantum dot." Nature 481.7381 (Jan. 19, 2012), pp. 344-347 and Online Supplementary Information.
Shi, Zhan, et al. "A Fast "hybrid" silicon double quantum dot qubit." Physical review letters 108.14 (Apr. 6, 2012), 140503, pp. 1-12.
Pla, Jarryd J., et al. "A single-atom electron spin qubit in silicon." Nature 489.7417 (2012), pp. 541-545 and Online Supplementary Information.
Shankar, S., et al. "Spin relaxation and coherence times for electrons at the Si/SiO2 interface." Physical Review B 82.19 (Dec. 15, 2010): 195323, pp. 1-6.
Yang, C.H., et al. "Spin-valley lifetimes in a silicon quantum dot with tunable valley splitting." Nature communications 4 (May 30, 2013), pp. 1-17.

* cited by examiner

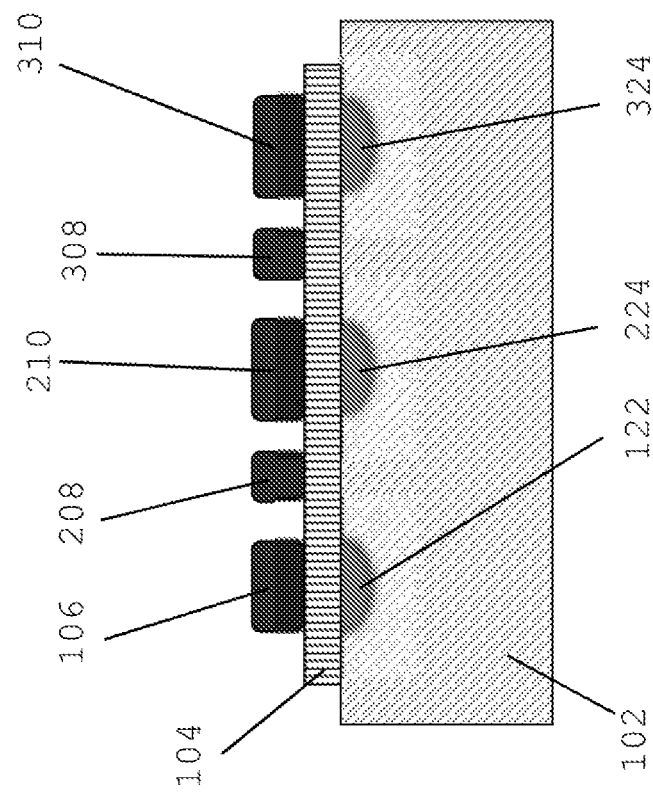
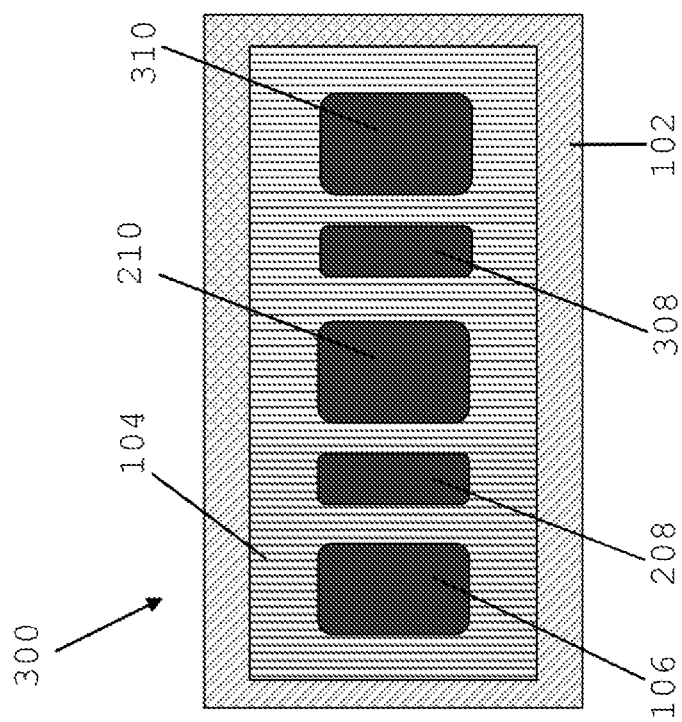
FIGURE 3(b)
FIGURE 3(a)

ADVANCED PROCESSING APPARATUS

FIELD OF THE INVENTION

The present invention relates to a processing element for an advanced processing apparatus, and particularly, but not exclusively, to a quantum processing apparatus and a processing element for the quantum processing apparatus.

BACKGROUND OF THE INVENTION

The power and capacity of computing components such as microprocessors and memory circuits has been increasing for the last 50 years, as the size of the functional units, such as transistors, has been decreasing. This trend is now reaching a limit, however, as it is difficult to make the current functional units (such as MOSFETs) any smaller without affecting their operation.

The technology employed to manufacture conventional silicon integrated circuits has developed over the last 50 years and is today well established. Current microprocessors feature several hundreds of millions of transistors which are manufactured in high throughput lines.

Developments are ongoing to implement new types of advanced processing apparatus that can implement powerful computations using a different approach than current processors. Such advanced processing apparatus promise computational capacities well beyond current devices. For example, quantum processors are being developed which can perform computations according to the rules of quantum mechanics. Approaches to the realisation of devices for implementing quantum bits (qubits), the basic computational unit of a quantum processor, have been explored with different levels of success.

For example, semiconductor based qubits have been developed and described in a number of earlier patent publications, including U.S. Pat. No. 6,472,681 (Kane), U.S. Pat. No. 6,369,404 (Kane). These qubits are based on the exploitation of the quantum effects of a single dopant atom in a silicon crystalline lattice. Although, the properties of a single dopant atom in silicon are promising to implement qubits, the techniques for manufacturing these devices include complex nanofabrication solutions, as discussed for example in U.S. Pat. No. 7,547,648 (Ruess et al.).

It has also been proposed to encode quantum information using the spin states of semiconductor quantum dots (Loss and DiVincenzo (Loss, DiVincenzo, DP quantum computation with quantum dots. *Phys Rev. A*56, 120; 1998)). This proposal primarily envisaged the use of quantum dots formed using electrostatic gates on a GaAs/AlGaAs heterostructure. However, the limited coherence time and the associated fidelity of the quantum state in these systems represent a significant hurdle to application of quantum dots in a quantum processor. Experimental work has been done in GaAs/AlGaAs on quantum dot qubits, but to realise large-scale arrays of such structures will require new manufacturing process technologies to be developed. More importantly, these materials suffer from problems with fidelity and dephasing time due to the presence of nuclear spins that are inherent to the GaAs crystal lattice.

SUMMARY OF THE INVENTION

In accordance with a first aspect, the present invention provides a processing element for an advanced processing apparatus, comprising silicon and a dielectric material forming an interface between the materials, a confining arrangement for confining one or more electrons or holes in the silicon to form a quantum dot, and a control arrangement for controlling a quantum property of the quantum dot to operate as a qubit.

In an embodiment, the dielectric comprises substantially silicon dioxide. The silicon/silicon dioxide interface has previously been considered to provide a relatively high disorder environment and therefore not conducive to the formation of a viable quantum dot that could be used in quantum processing. The Applicants have found that a viable quantum dot can be achieved, and the quantum properties of the quantum dot can be controlled to operate as a qubit, and, in an embodiment, with high control fidelity.

The Si/SiO$_2$ interface has been a central component of Complementary-Metal-Oxide-Semiconductor (CMOS) integrated circuit technologies for most of the past two decades.

In an embodiment, the surface silicon layer in which the quantum dots are formed is isotopically enriched to contain predominantly $^{28}$Si atoms, and this embodiment therefore takes advantage of the long coherence times that become available due to the low nuclear spin concentration in the silicon lattice. A very small nuclear spin background will still remain due to the small remaining fraction of $^{29}$Si atoms. In an embodiment, an underlying handle wafer, which is well separated spatially from the quantum dots, may comprise naturally occurring silicon, which contains of order of 5 percent of $^{29}$Si atoms.

In an embodiment, the control arrangement comprises a control arranged to tune the quantum dot so that the energy at which the state of the quantum dot is affected can be adjusted over a range of energy values. In an embodiment, the quantum dot is formed by one or more confined electrons or holes and the quantum property comprises electron or hole spin. The control is arranged to apply a voltage to tune the electron or hole spin resonance frequency.

Strong spin-orbit coupling in InAs has enabled qubits to be realised in double quantum dots with distinct electron or hole effective g-factors. In silicon the spin-orbit coupling is much smaller. Despite this, however, the Applicants have found, surprisingly, that a highly tuneable quantum dot can be achieved. In an embodiment, where the quantum dot contains one electron or hole, or a number of electrons or holes, the Applicants have found that the internal electrical field, which can be varied by as much as 3 MV/m, results in a Stark shift that can tune the electron spin resonance (ESR) frequency by greater than 8 MHz. This is a substantial shift compared to the ESR line-width, which is of the order of 2 kHz, due to the long spin coherence time in isotopically enriched silicon. This advantageously enables tuning of the quantum dot so its state can be affected at different frequencies. This can advantageously enable addressability of many quantum dots such as this, facilitating the possibility of large-scale voltage addressable qubit systems.

It is a further advantage of at least an embodiment of the invention, that a system incorporating a processing element formed at a Si/SiO$_2$ interface can utilise the fabrication technologies that already exist for the manufacture of metal-oxide-semiconductor-field-effect-transistors MOSFET(s), that constitute today's computer processors.

In an embodiment, the processing element comprises a silicon substrate with a silicon dioxide layer formed on it, and various gates for the control arrangement formed in metal on the silicon dioxide layer. This is very similar to current MOSFET structures.

In accordance with a second aspect, the present invention provides an advanced processing apparatus which comprises a plurality of processing elements in accordance with the first aspect of the invention.

In an embodiment, an exchange control arrangement for controlling the exchange interaction between a plurality of processing elements is provided, in order to implement quantum processing. The advanced processing apparatus may therefore be implemented as a quantum computer.

In an embodiment, control lines are provided to tune the plurality of quantum dots to different energy values so that they are individually addressable or addressable in groups by appropriate electromagnetic signals to switch the state of the quantum dots.

In accordance with the third aspect, the present invention provides a method of operation of a quantum processing element, the processing element comprising silicon and a dielectric material forming an interface between the materials, a confining arrangement for confining one or more electrons or holes in the silicon to form a quantum dot, and a control arrangement for controlling a quantum property of the quantum dot to operate as a qubit, the method comprising the steps of applying a signal via the control arrangement to control the quantum property of the quantum dot.

In an embodiment, the method comprises the further step of applying a further control signal to tune the quantum dot so the energy at which the state of the qubit is affected is adjusted to an energy value from a range of available energy values.

In an embodiment, the confining arrangement is arranged to confine one or more electrons or holes to form a pair of quantum dots and the control arrangement is arranged to control a singlet and triplet state of the pair of quantum dots to encode qubit logic states and the method comprises the step of applying a signal via the control arrangement to control the state of the qubit.

In other embodiments, the confining arrangement is arranged to confine one or more electrons or holes to form at least three quantum dots and the control arrangement is arranged to control spin states of the at least three quantum dots to encode qubit logic states and the method comprises the step of applying a signal via the control arrangement to control the state of the qubit.

In an embodiment, the method comprises the step of applying voltage signals to the control arrangement to control the qubit logic states by tuning an exchange interaction between spins of electrons or holes in one or more of the quantum dots.

In accordance with a fourth aspect, the present invention provides a method of implementing a quantum processing element, comprising the steps of applying an electric field to form a quantum dot at an interface between silicon and a dielectric material, and applying a further electromagnetic field to affect a quantum state of the quantum dot.

Advantageous embodiments of the present invention provide a quantum processing device which uses the quantum properties of a confined set of electrons or holes located about an interface between a silicon layer and a silicon dioxide layer. The electrons or holes can be confined by applying an appropriate electrostatic field, through one or more gate electrodes, to an area about the interface. A quantum bit can be realised by addressing a quantum property, such as the spin, of one or more of the confined electrons or holes, via an electromagnetic stimulus applied through the one or more gate electrodes, or by using an AC electromagnetic field applied externally to the device, or both.

BRIEF DESCRIPTION OF THE DRAWINGS

Features and advantages of the present invention will become apparent from the following description of embodiments thereof, by way of example only, with reference to the accompanying drawings, in which;

FIGS. 1 to 3 show top views and side cross-sectional views of devices in accordance with embodiments of the present invention;

DETAILED DESCRIPTION OF EMBODIMENTS

Figure 1B:
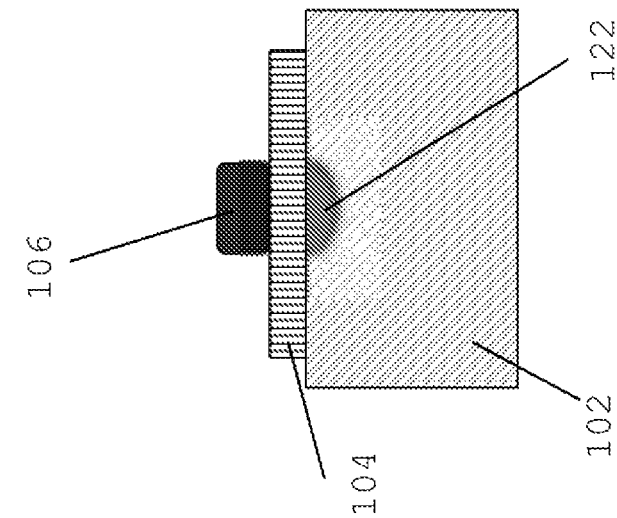
Figure 1A:
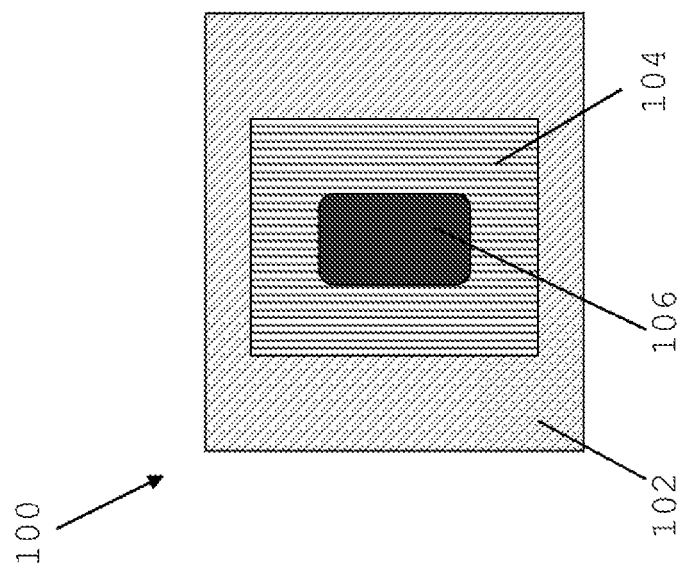

Referring to FIG. 1, a processing element 100 in accordance with an embodiment of the invention is shown in plan (FIG. 1(a)) and side cross-sectional (FIG. 1(b)) views. The processing element 100 may be implemented as a qubit for a quantum computer comprising a plurality of these processing elements. In this embodiment, the processing element comprises a silicon substrate 102 and a dielectric 104, in this example being silicon dioxide. A gate electrode 106 is provided and is operable to form a quantum dot proximate the $Si/SiO_2$ interface. Gate 106, is also arranged to modify a quantum property of the quantum dot. In this example, the quantum dot may comprise one or more electrons or holes and the quantum property being controlled is the effective g-factor of the electrons or holes. Throughout this specification the term "effective g-factor", is used broadly to indicate a ratio between the spin resonance frequency for the spin system and the DC magnetic field.

Gate 106 may also be used to directly control the spin of the electrons or holes using an AC electric field.

It can be seen that the structure of the device which defines the quantum dot is similar to the gate, the gate oxide and the semiconductor material of a MOS device.

In more detail, for the embodiment shown in FIG. 1, the processing element 100 comprises a silicon layer 102 topped by a silicon dioxide layer 104 and a gate electrode 106. In this embodiment, isotopically enriched silicon $^{28}Si$ is used. The isotopically enriched silicon $^{28}Si$ 102 may be an epitaxial layer grown on a conventional silicon substrate. FIG. 1(b) is a cross sectional view of the structure of FIG. 1(a) which shows an area 122 where either electrons or holes may be isolated. Sufficiently positive voltages applied to gate electrode 106 will cause electrons to be isolated in the area 122, while sufficiently negative voltages applied to gate electrode 106 will cause holes to be isolated in area 122.

In this embodiment, a single electron is isolated in area 122, thus forming an isolated quantum dot and a single qubit is encoded in the spin of the isolated electron.

In alternative embodiments, a qubit may be encoded using the spins of multiple electrons or holes in a single quantum dot. In further alternative embodiments, a single qubit may be encoded in the spin of one or more electrons or holes of one or more quantum dots.

Figure 2B:
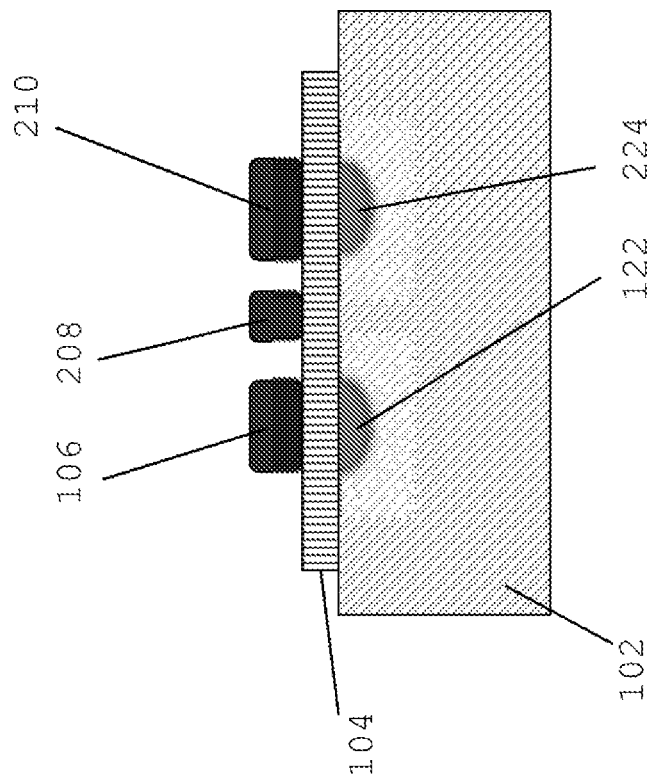
Figure 2A:
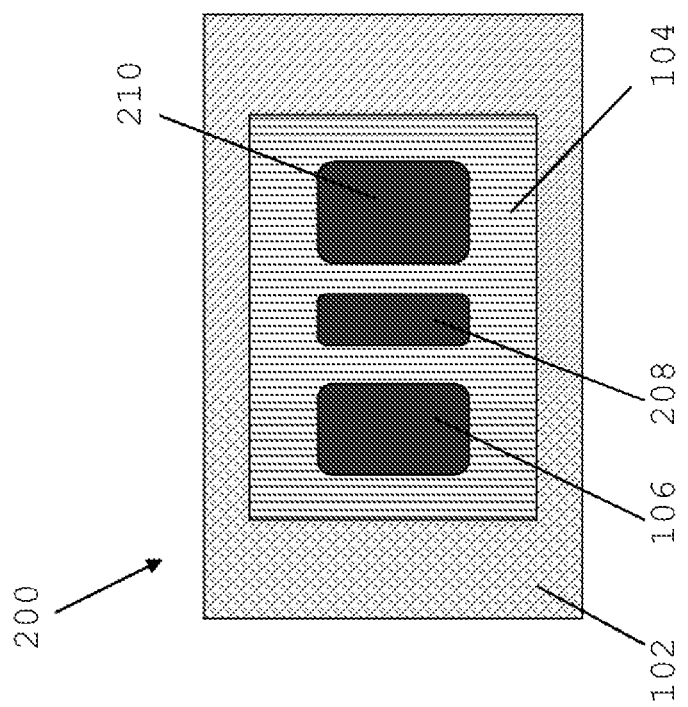

Referring now to FIG. 2 there is shown a processing element 200 in accordance with an embodiment of the invention in plan (FIG. 2(a)) and side cross-sectional (FIG. 2(b)) views. As for the processing element 100 of FIG. 1, processing element 200 comprises an isotopically enriched silicon $^{28}Si$ layer 102 topped by a silicon dioxide layer 104.

Besides gate electrode 106, processing element 200 comprises two further gate electrodes 208 and 210. FIG. 2(b) is a cross sectional view of the structure of FIG. 2(a) which shows two areas 122 and 224 where either electrons or holes may be isolated. Sufficiently positive voltages applied to gate electrodes 106 and 210 will cause electrons to be isolated in the areas 122 and 224, while sufficiently negative voltages applied to gate electrodes 106 and 210 will cause holes to be isolated in areas 122 and 224.

In this embodiment, one or more electrons or holes are isolated in each of the areas 122 and 224, thus forming two quantum dots. Structure 200 may be used to realise a pair of qubits, where each qubit is encoded using the spin of the electrons or holes in regions 122 and 224. In this case, an electromagnetic field may be applied to gate electrode 208 to control coupling of the qubits encoded on the spin of electrons 122 and 224. Alternatively, a single qubit may be mapped onto the pair of quantum dots 122 and 224 by using the m=±1 spin triplet states, the m=0 spin triplet state, and the spin singlet state. Such singlet-triplet qubits could not rely on a magnetic field gradient from lattice nuclear spins as in the case for quantum dots in GaAs, since these are absent in isotopically enriched silicon, however a magnetic field gradient could be realized via an on-chip nanomagnet. Alternatively, voltages applied to gate electrodes 106 and 210 could be used to control the effective g-factor of the electrons or holes. Furthermore, a combination of voltages applied to gate electrodes 106, 208 and 210 may be used to control the exchange coupling between spins in each of the two quantum dots 122 and 224.

Referring now to FIG. 3 there is shown a processing element 300 in accordance with an embodiment of the invention in plan (FIG. 2(a)) and side cross-sectional (FIG. 2(b)) views. As for the processing element 200 of FIG. 2, processing element 300 comprises an isotopically enriched silicon $^{28}$Si layer 102 topped by a silicon dioxide layer 104. Besides gate electrodes 106, 208 and 210, processing element 300 comprises two further gate electrodes 308 and 310. FIG. 3(b) is a cross sectional view of the structure of FIG. 3(a) which shows three areas 122, 224 and 324 where either electrons or holes may be isolated. Sufficiently positive voltages applied to gate electrodes 106, 210 and 310 will cause electrons to be isolated in the areas 122, 224 and 324, while sufficiently negative voltages applied to gate electrodes 106, 210 and 310 will cause holes to be isolated in areas 122, 224 and 324.

In this embodiment, one or more electrons or holes are isolated in each of the areas 122, 224 and 324, thus forming three quantum dots. Structure 300 may be used to realise three qubits, where each qubit is encoded on the spin of electrons or holes in regions 122, 224 and 324. In this case, an electromagnetic field may be applied to gate electrodes 208 and 308 to control coupling of the qubits encoded in the spin of the electrons or holes in the regions 122, 224 and 324. Alternatively, a single qubit may be mapped onto the three quantum dots 122, 224 and 324 to implement an exchange-only spin qubit, in a manner analogous with that described by DiVincenzo et al. (Nature 408, 339-342 (2000)). Voltages applied to gate electrodes 106, 210 and 310 may be used to control the effective g-factor of the electrons and holes. Furthermore, a combination of voltages applied to gate electrodes 106, 208, 210, 308 and 310 may be used to control the exchange coupling between spins in each of the three quantum dots 122, 224 and 324.

The implementation of a spin qubit in a silicon-silicon dioxide system provides increased spin coherence compared with most compound semiconductors due to the reduced hyperfine coupling of the qubit to nuclear spins in the host crystal. The two dimensional electron gas confined at the Si/SiO$_2$ interface can be depleted to isolate quantum dots 122, 224 and 324 by using an electrostatic field through gates 106, 208, 210, 308 and 310. Other surface gate electrode structures may also be employed to aid in confinement of the quantum dots. In some embodiments, further elements can be introduced at the interface to promote electron confinement, such as doped regions or dielectric regions. The overall concentration of electrons at the interface may be modified using an isolated global gate above the device, or by using an isolated global gate below the device.

The control of the qubit is generally obtained through an electromagnetic signal. The electromagnetic signal may be applied to gates disposed about the qubit. In the embodiment where the qubit is mapped onto the spin of a single quantum dot, a DC magnetic field is also applied to split the quantum states and thereby define the logical basis states of the qubit.

It had previously been thought that a Si/SiO$_2$ interface would have too many defects, or that the SiO$_2$ would contain too many random charge centres, to allow realisation of a quantum dot that could be used as a qubit. In comparison with other semiconductor interfaces that can be used to confine quantum dots, such as the Ga/GaAs interface, the Si/SiO$_2$ interface is a relatively high disorder environment and therefore was thought not conducive to qubit operation.

The Applicants have also discovered that, surprisingly, the frequency of the AC electromagnetic signal required to interact with the qubit in its single electron mode can be varied by tuning the g-factor of the electron, and therefore also its Zeeman energy. For example, the effective g-factor of the electrons or holes confined in the area 122 of processing element 100 may be varied via an electromagnetic input provided through gate 106 or additional electrical gates disposed about the qubit. The ability to tune the qubit can facilitate the operation of an advanced processing apparatus which comprises many of these qubits. The qubits can be addressed or controlled by varying the effective g-factor of the electrons or holes which comprise the qubit. This control technique allows for the addressing of qubits individually or in groups.

A more detailed embodiment of a processing element in accordance with the present invention will now be described with reference to FIG. 4. The embodiment depicted in FIG. 4 may be used to implement single qubit operations. In a scalable architecture with many qubits a variation of this embodiment would be used. In particular, a more compact qubit sensing module would be used.

Figure 4:
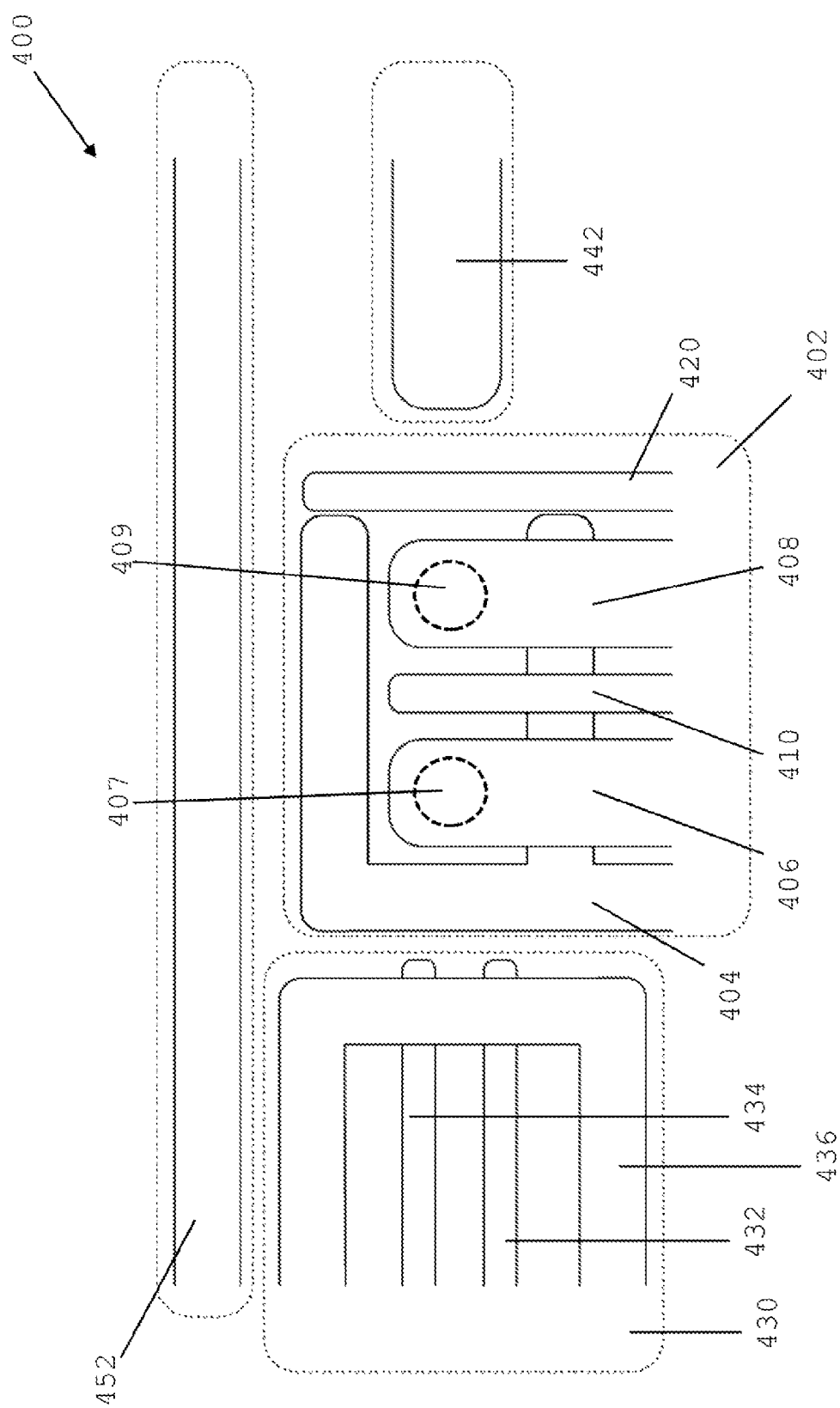
FIG. 4 shows a top view of a device in accordance with a further embodiment.

FIG. 4 shows a top view of an electrode structure 400 for interacting with a qubit in a Si/SiO$_2$ system. Qubit module 402 comprises a confinement gate 404, two gates 406 and 408 which can induce quantum dots 407 and 409 below them, and two barrier gates 410 and 420.

Sensor module 430 comprises two barrier gates 432 and 434, and transport gate 436. Structure 400 also comprises a reservoir gate 442 and a control gate 452.

Different geometrical and biasing configurations of the gates 404, 406, 408, 410 and 420 can be adopted to create one or more quantum dots. In this particular embodiment gate 406 can be biased positively to create a single quantum dot 407 directly below the Si/SiO$_2$ interface, and below the qubit module 402. The area under qubit module 402 is tunnel coupled with the area under reservoir gate 442 and is positioned in proximity of the sensor module 430. This allows improved readout sensitivity through the single electron transistor structure operated using electrodes 432, 434, and 436. Control gate 452 is used to provide a suitable AC electromagnetic stimulus which couples with the qubit at a given frequency to modify a state of the qubit.

In some embodiments, the electromagnetic field created by a current flowing through the control gate 452 can interact with the qubit via electron spin resonance (ESR) to modify the state of the qubit.

The ESR frequency of the qubit can be tuned by modifying the effective g-factor of the confined electron so that interaction with the qubit is only possible at a particular frequency. The frequency of the AC magnetic field, generated by control line 452, can be varied to interact with different qubits, each with a respective ESR frequency, providing the possibility of separately addressing each one, or a subset, of qubits in an array of qubits.

Despite the small spin-orbit coupling in Si, using structure 400 the effective g-factor of the confined electron can be tuned by modifying one or more gate voltages in the qubit module 402. The internal electric field in the vicinity of the quantum dots can be varied by as much as 3 MV/m, resulting in a Stark shift that can tune the electron ESR frequency by more than 8 MHz. Due to the very narrow ESR spectral width in $^{28}$Si, which has been measured in one device to be about 2 kHz, the qubit operation frequency can be tuned by more than 3000 times the minimum ESR line spectral width.

The structures shown in FIGS. 1 to 4 are compatible with the fabrication methods and manufacturing equipment common in the microelectronic industry, in particular in the field of very high density integrated circuits based on MOSFETs. This provides potential for scalability of the qubit described generically in FIGS. 1 to 3 to architectures comprising a plurality of qubits, each singularly addressable by operating respective gate voltages.

Figure 5:
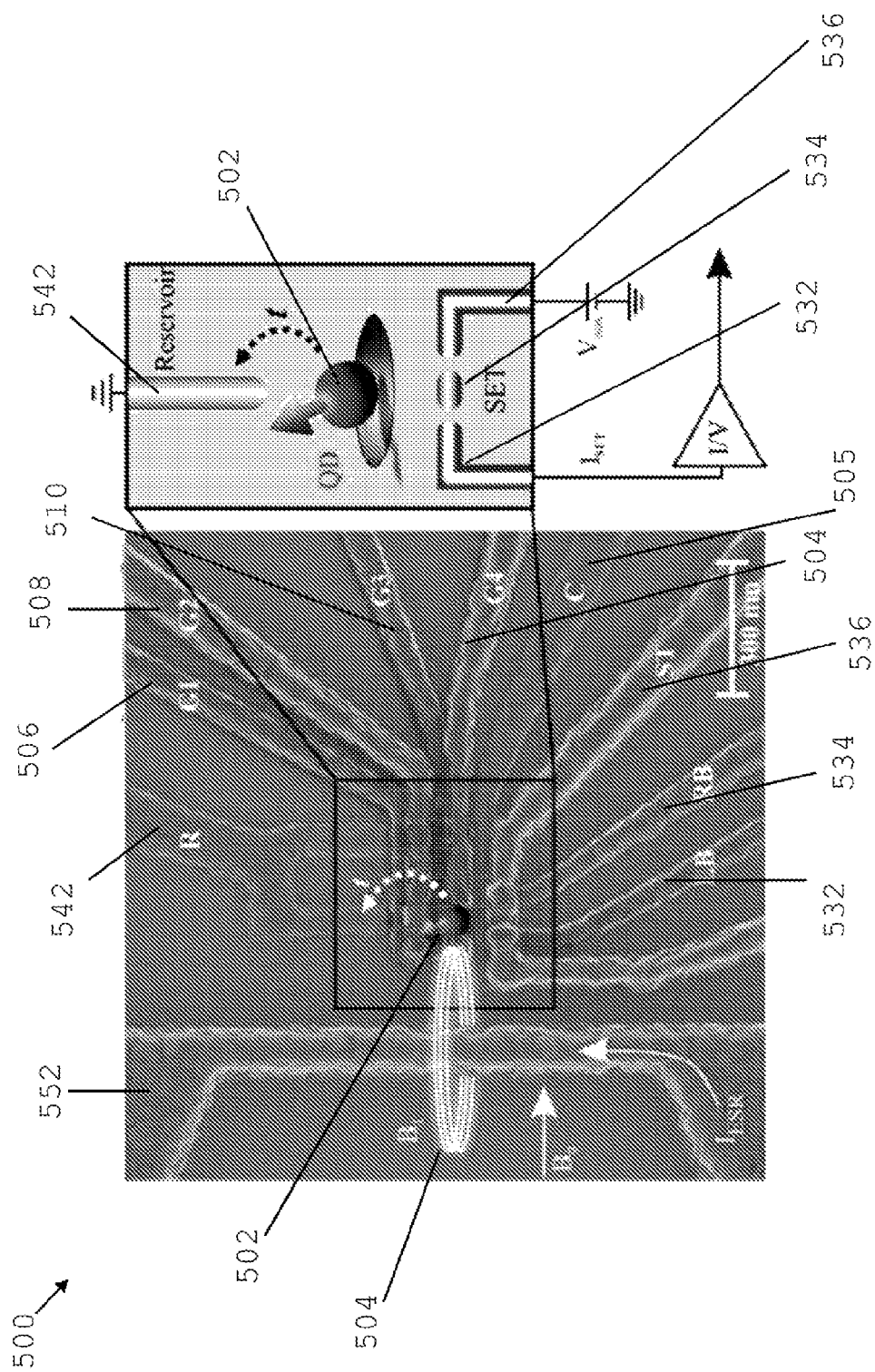
FIG. 5 is an SEM-image of a device in accordance with an embodiment.

Referring now to FIG. 5 there is shown an SEM-image of a device 300 fabricated using a multi-level gate-stack silicon MOS technology. The device 500 embodies all the components discussed for the structure 400 of FIG. 4. The device 500 is fabricated on an epitaxially grown, isotopically enriched $^{28}$Si epilayer with a residual concentration of $^{29}$Si at 800 ppm and an epilayer thickness of around 1 micron. The control gate 452 is realised in the form of an on-chip transmission line 552 to manipulate the spin states of the quantum dot using ESR pulses. The sensor module 430 is provided in the form of a single electron transistor (SET) adjacent to the quantum dot structure and comprises conductive lines 532, 534, and 536. The SET is used as a sensor to monitor the electron occupancy within the quantum dot. In alternative embodiments, sensor module 430 may be provided in the form of a quantum point contact (QPC), a narrow constriction in a conducting region, or alternative constructions that are sensitive to electric fields.

To control the qubit 502, a microwave pulse to the on-chip transmission line 552 can be applied to create a local AC magnetic field 504 which drives transitions between the spin-down and spin-up states of the confined electron(s) in the quantum dot. When an external DC magnetic field is applied to the device with a magnitude $B_{DC}$=1.4 T, for example, the resonance frequency of the quantum dot $v_0 = (g^* \mu_B/h) B_{DC}$=39.14 GHz. Here, the value of the effective g-factor for the confined electron is approximately $g^*$=1.998. A microwave pulse applied to the transmission line 552 at the resonance frequency $v_0$, as defined above, will then drive transitions between the qubit logic states.

Figure 6B:
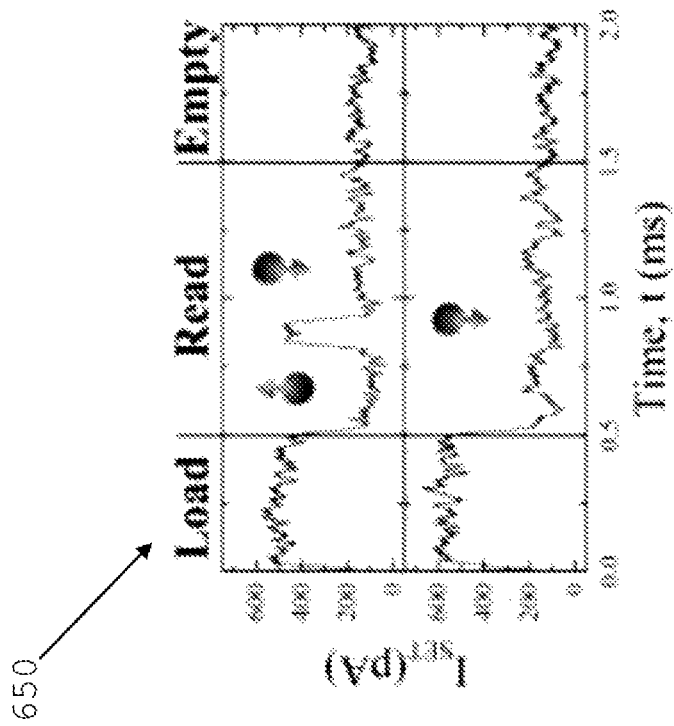
FIGS. 6 to 12 show diagrams illustrating experimental results obtained by performing measurements on the device of FIG. 5.
Figure 6A:
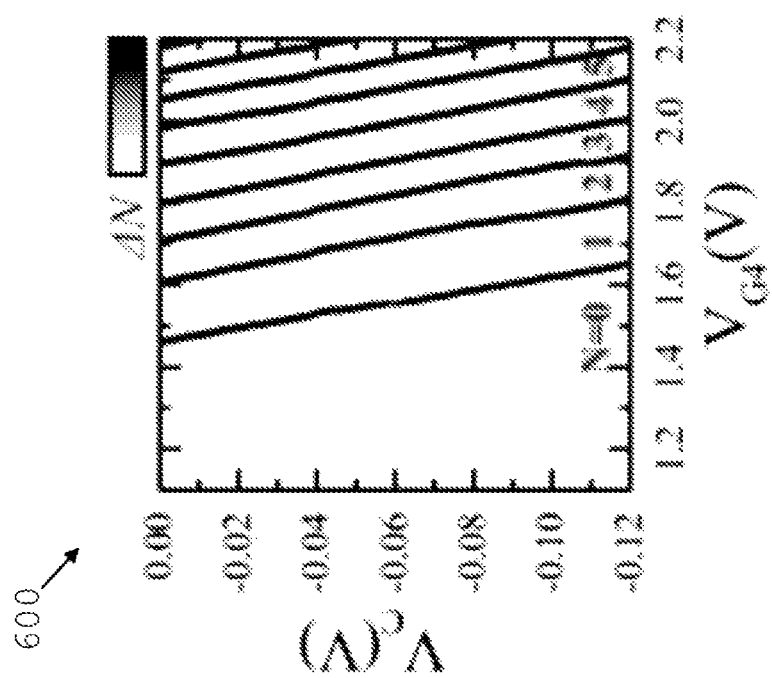

Referring now to FIG. 6, there is shown a pulsed-voltage charge stability diagram 600 when a square pulse of 40 mV peak-to-peak at 174 Hz applied to electrode 504. Diagram 600 demonstrates the depletion of the last electron in the dot. Grey-scale indicates the excess electron occupancy (ΔN) in the dot for each charge addition. Diagram 650 shows an example of single-shot spin readout measurements for the last electron, using spin-to-charge conversion. By changing the voltage on electrode 504, the quantum dot can be loaded or emptied. This allows performing spin readout in a single-shot measurement via energy-selective tunneling. The measurements shown in FIG. 6 are performed in a dilution refrigerator with base temperature T=50 mK and a DC magnetic field $B_{DC}$=1.4 T.

The stability diagram for the quantum dot is obtained by combining charge sensing and gate pulsing with dynamic voltage compensation. The depletion of the last electron in the dot is clearly observed in FIG. 6(a), with no further charge transitions for VG$_4$ (elec 304)<1.6 V. The tunnel coupling between dot and reservoir 342 is tuned using the barrier gate G$_3$ 510 to yield a tunnel time t~100 μs.

Figure 7:
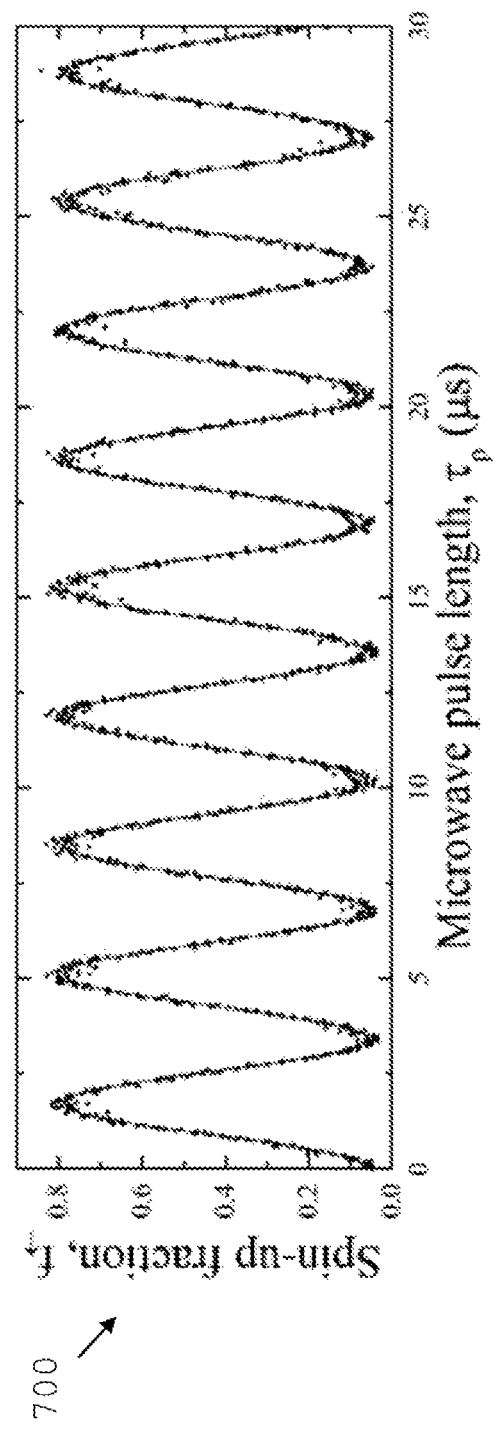
Figure 8:
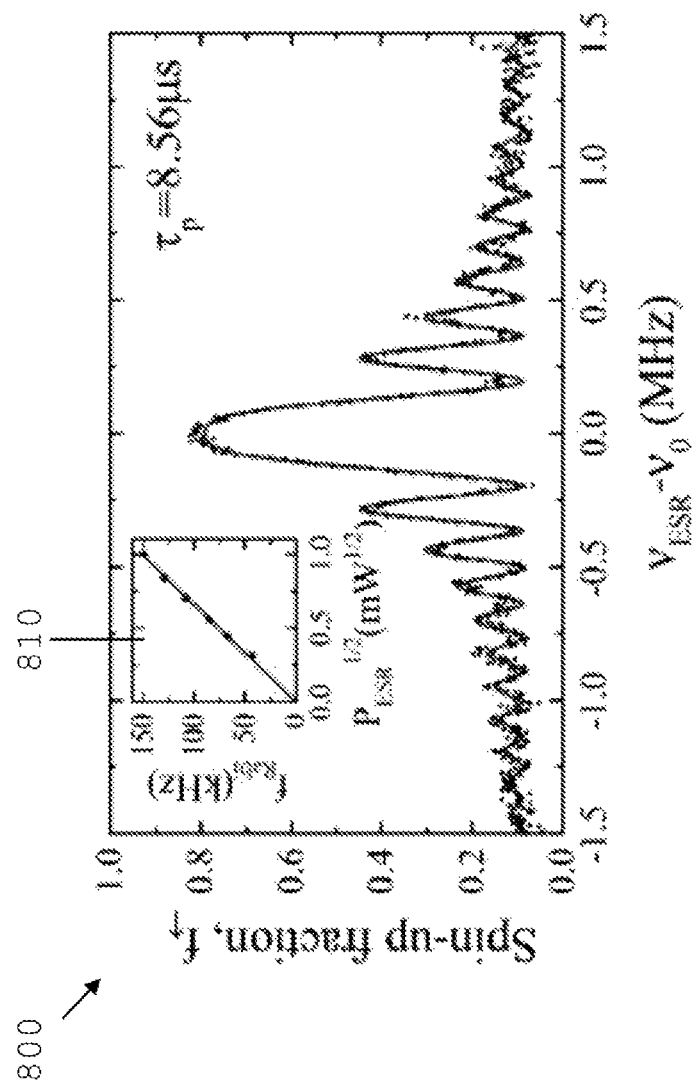

Over an operation time of 30 μs the qubit demonstrates coherent oscillations that coincide with $f_↑* = \Omega^2/Q_R^2 \sin^2(\Omega R \tau/2)$, implying that the qubit does not have significant decoherence over this timescale. FIG. 7 shows sinusoidal Rabi oscillations 700 obtained by varying the ESR pulse length $\tau_p$, with no significant decay of the oscillations observed over 30 μs, which is the maximum pulse length shown FIG. 8. FIG. 8 shows diagram 800 reporting the oscillations while varying the frequency $v_{ESR}$. Confirmation that these are Rabi oscillations follows from the dependence $f_{Rabi} \alpha B_1 \alpha P_{ESR}^{1/2}$ as shown in inset 810, where $P_{ESR}$ is the applied microwave source power, and also from the increase in the Rabi frequency for non-zero detuning frequency.

When the detuning frequency is non-zero, coherent oscillations known as Ramsey fringes arise when the spin is pointing in the x-y plane of the Bloch sphere. These fringes can be detected by applying two π/2-pulses separated by a delay time τ, followed by readout of the spin state.

Figures 9A, 9B:
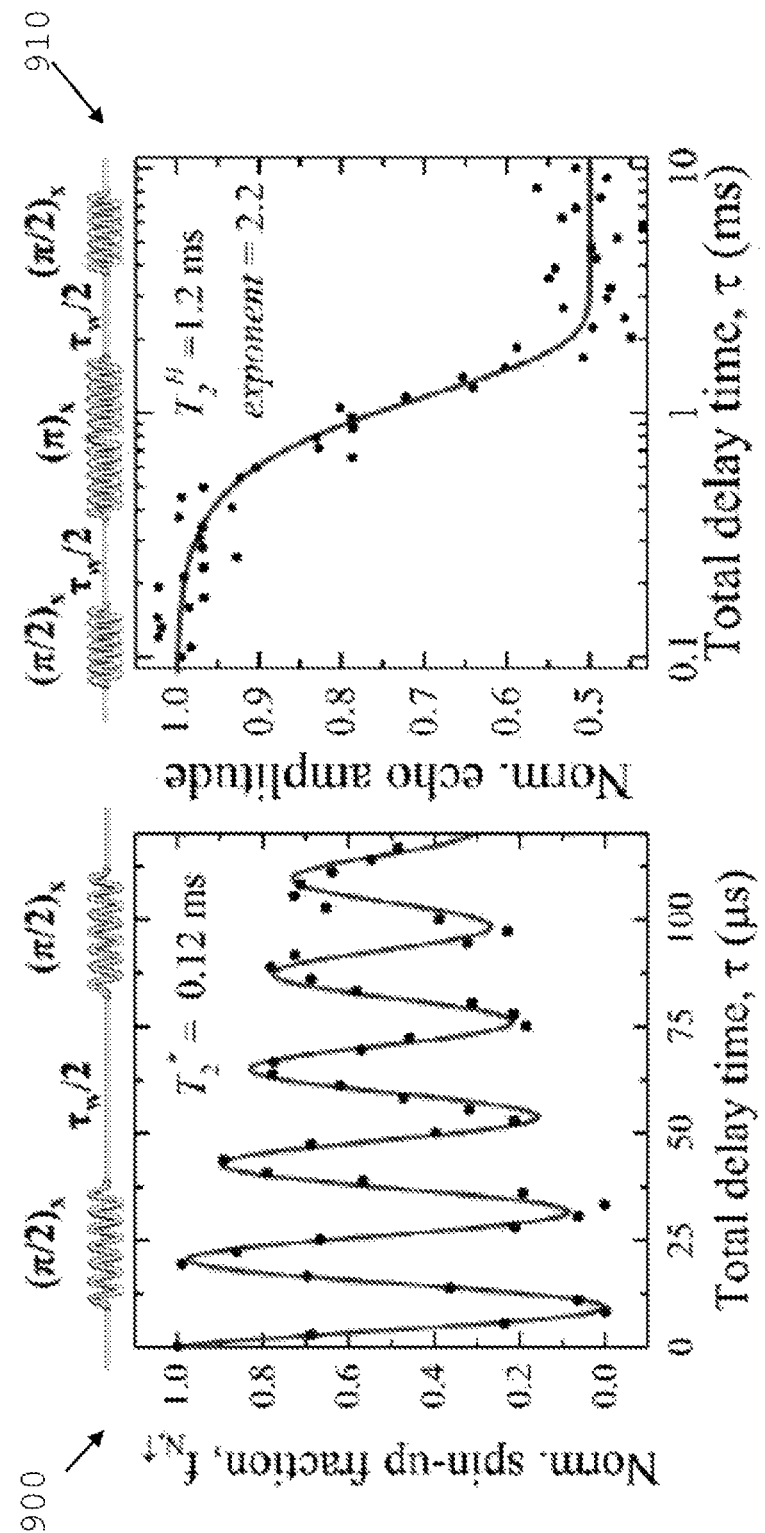

Referring now to FIG. 9(a) there is shown a plot 900 reporting the resulting Ramsey oscillations, and a characteristic decay time $T_2^*$=140 μs can be extracted from the oscillations 900. The corresponding spectral linewidth $1/\pi T_2^*$=2.6 kHz is close to the smallest measured ESR peak width Δv=(2.4±0.2) kHz measured at $P_{ESR}$=−40 dBm. This is a dramatic improvement in $T_2^*$ compared with other quantum dot spin qubit systems and is a direct demonstration of the importance of removing the random fluctuations in magnetic field caused by lattice nuclear spins.

Slow environmental changes between individual single-shot readout events are one of the main factors leading to the decay of the Ramsey coherence fringes. To remove the effects of this noise a Hahn-echo technique can be applied, where a $\pi_x$ pulse is applied exactly in between two $\pi_x/2$ pulses, as shown in FIG. 9(b). From this we measure a spin coherence time $T_2^H$=1.2 ms. The Hahn echo amplitude decays with an exponent η=2.2, indicating that the dominant source of decoherence is 1/f noise. A further increase the coherence time can be obtained by applying a CPMG sequence, where a series of $\pi_y$ pulses are applied to refocus the signal.

Figures 10A, 10B:
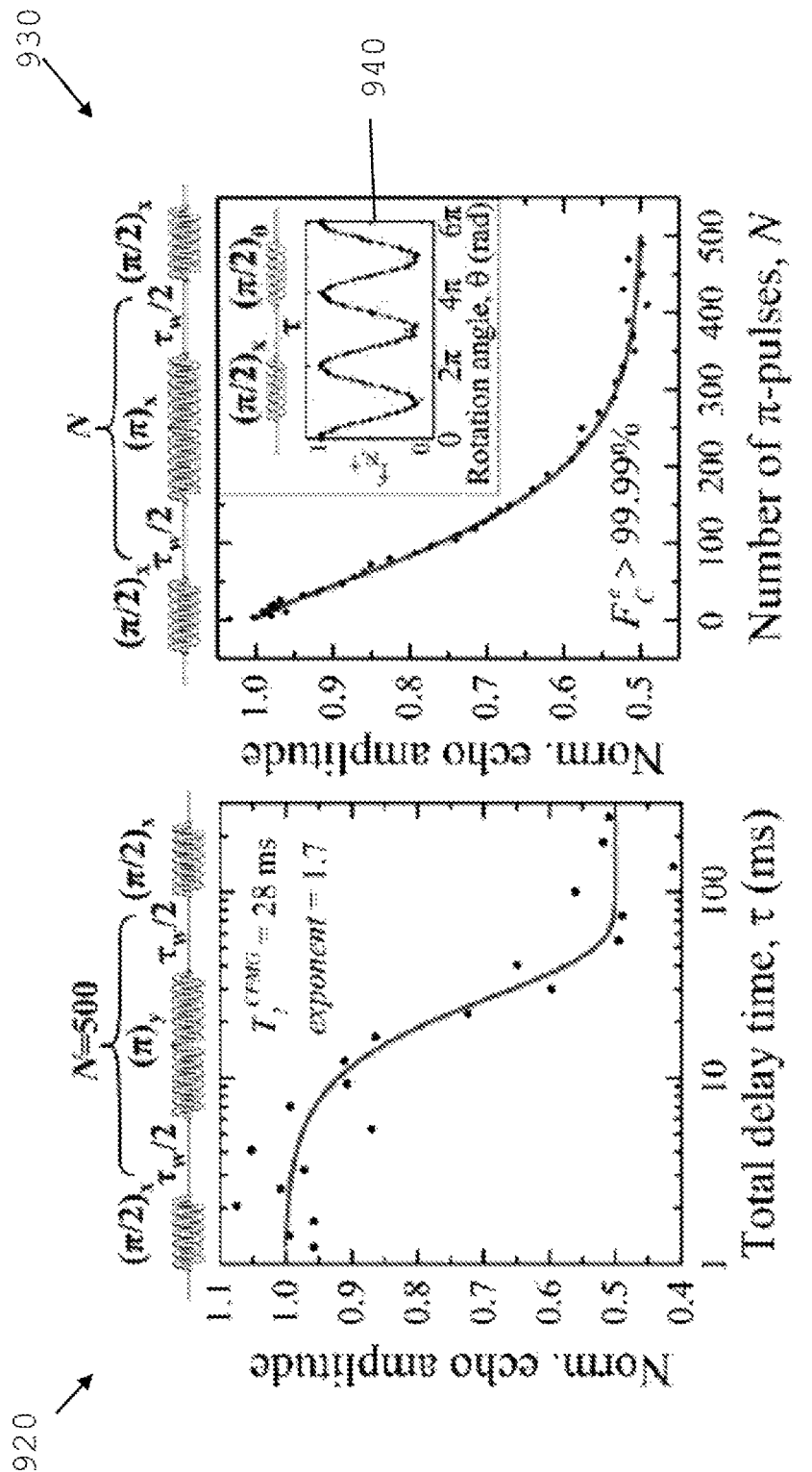

FIG. 10(a) shows an echo decay 920 obtained by applying 500 $\pi_y$ pulses, with a resulting coherence time of $T_2^{CPMG}$=28 ms.

The measurement fidelity $F_M$=92% and initialization fidelity $F_I$=95% are primarily limited by broadening in the electron reservoir. The intrinsic control fidelity $F_C$ of a π pulse can be calculated using the Rabi oscillation period $\tau_{2\pi}$=3.4 μs from FIG. 7 together with $T_2^*$, and we find $F_C$=99.999%.

FIG. 10(b) shows a measurement of the control fidelity by measuring the decay of the spin-up fraction as a function of the number of n pulses in a CP sequence 930. Rotation angle errors are additive in this sequence, and from the decay a control fidelity>99.99% can be extracted. This suggests that the pulse errors arise from the broadened spectral linewidth due to dephasing. This spin qubit therefore has a control fidelity that satisfies the stringent requirement of fault-tolerant quantum error correction codes. This has not been observed in other quantum dot systems.

It has been proposed that fault-tolerant quantum computation could be possible with error tolerances as high as 1% using surface codes. In the quantum device described herein a complete control over the Bloch sphere may be provided by exploiting the phase and the duration of the applied ESR pulse.

The inset 940 in FIG. 10(b) shows π/2 pulses applied with increasing phase difference, which were used to calibrate the rotation angle θ. The fitting of the data shows a frequency and phase error negligible compared to the effective control error, demonstrating that the complete Bloch sphere can be assessed with high fidelity.

Figure 11:
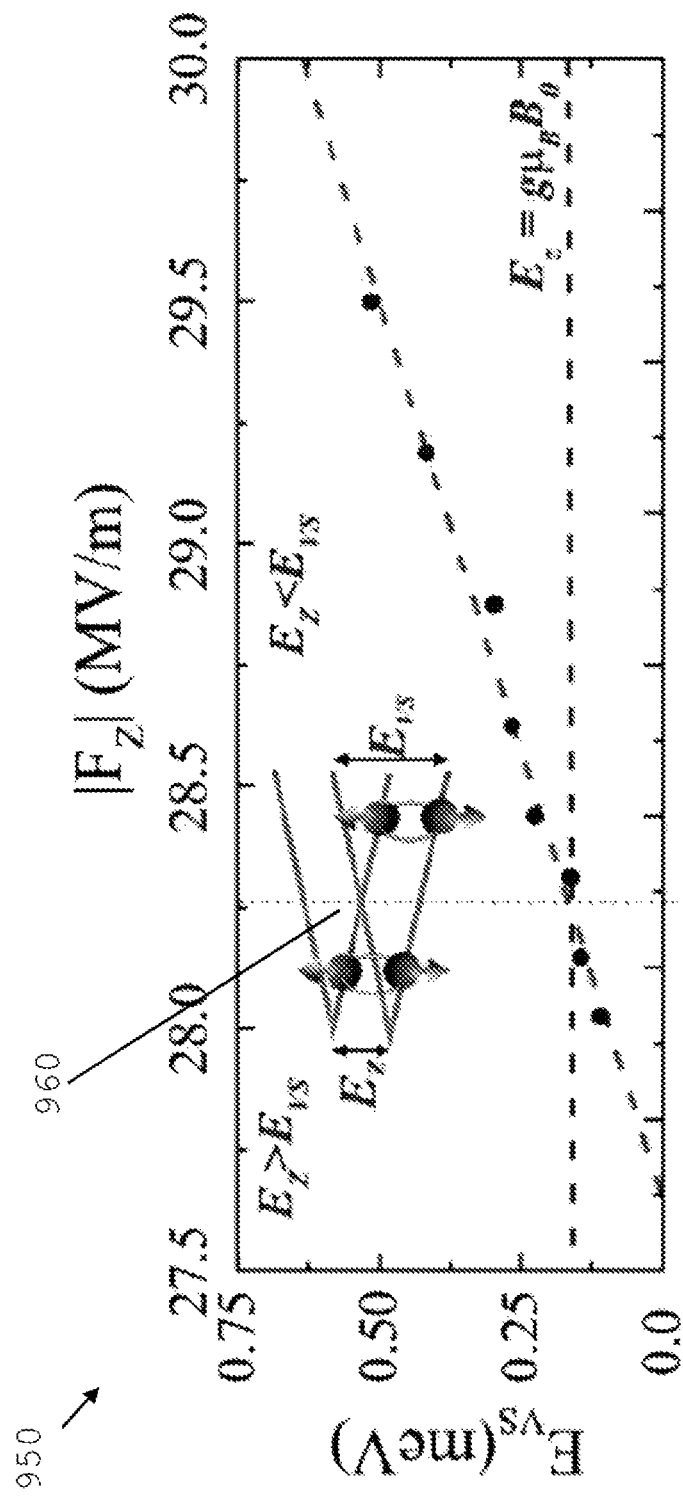

The vertical electric field $F_z$ in our quantum dot can be tuned over a large range by increasing the voltage on G4 (electrode 504), while reducing the voltage on C (electrode 505) to maintain an electron occupancy of N=1. Experiments on silicon dots have shown an anticrossing of the spin and valley states, as shown in inset 960 in FIG. 11 due to spin-orbit coupling, which occurs in a small energy window of neV to μeV, depending on the interface roughness. The magnitude of the valley splitting $E_{vs}$ can be measured using a 'hot-spot' spin relaxation technique as a function of gate voltage. FIG. 11 shows the results 950 of these measurements. A linear dependence of $E_{vs}$ upon $F_z$ is measured that differs by only 12% from a similar device reported previously by Yang et al. (Nature Communications v 4, p 4069 (4013)).

Figure 12:
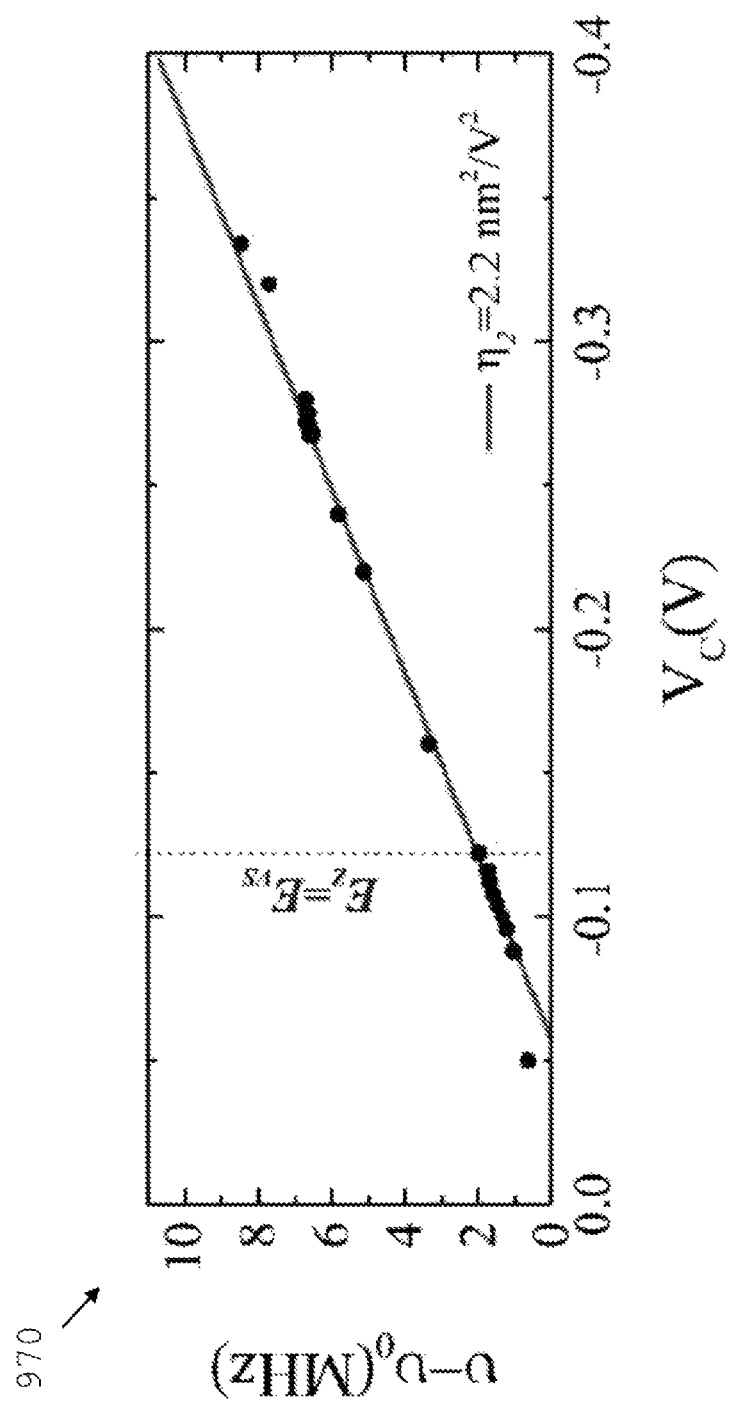

FIG. 12 a plot 970 of the qubit resonance frequency as a function of an applied gate voltage on the quantum dot ($V_c$) due to a small but finite Stark shift. The red line is a fit using $g(|Fz|)/g(0)-1=\eta_2|Fz|^2$, with $\eta_2=2.2$ nm$^2$/V$^2$. The vertical electric field $F_z$ (top axis) is calculated from the applied gate voltages.

The same internal electric field that is to tune the valley splitting can also be used to tune the qubit resonance frequency by more than 8 MHz corresponding to more than 3000 times the minimum observed ESR linewidth. This strong tunability is remarkable for a system with these long coherence times and provides excellent prospects for scalability. The device described in this embodiment can be operated in regimes both above and below the spin-valley anticrossing with no discernable impact on the ESR frequency dependence with Fz. This provides a gate-addressable qubit device with high-fidelity which operates well away from the valley anticrossing point, where the relaxation time drops.

In a further embodiment, the processing element may be implemented using a single control gate on a dielectric silicon stack, creating a MOS structure. The single control gate in this embodiment can have electromagnetic signal(s) applied to create a single quantum dot, and can also interact with the quantum dot to operate the quantum dot as a qubit.

The excellent gate addressability of the processing element of the embodiments described above opens the prospects for many qubits to be integrated on a single chip, with global AC magnetic fields applied via a cavity or on-chip transmission lines to realise single qubit operations. Two-qubit operations may then be achieved via gate control and exchange coupling between pairs of quantum dots. An advanced processing apparatus comprising many qubits in accordance with embodiments of the present invention is therefore realisable. One control line per qubit may be sufficient. A confinement potential may be realised with one gate designed as a large grid, and one top gate for each qubit for addressing and controlling the exchange coupling to the other qubits.

Further, the device structure used here can easily be modified to use poly-silicon gate electrodes and standard complementary metal-oxide-semiconductor (CMOS) manufacturing technologies that are currently used to fabricate more than one billion transistors on a single chip.

In the above embodiments the dielectric is silicon dioxide. The invention is not limited to this dielectric, however, and other dielectrics may be utilised in place of $SiO_2$.

The processing element of the above embodiments may be operated at very low temperatures, in the order of 0.1 to 1 K, preferably around 0.5 K. Appropriate cooling apparatus is provided.

Appropriate voltage sources and signal sources are also provided for control of the processing element. Some or all of these voltage and signal sources could be integrated onto the processor chip using conventional microelectronics, or they may be provided by an ancillary controller chip.

In some of the embodiments described above, electron spin resonance is used to alter the spins of the qubits. The invention is not limited to this and alternatives may be used. For example, a voltage pulse may be used to control the qubit states, particularly for the two dot or three dot qubit embodiments.

In some of the embodiments described above, the quantum state affected is spin. The "spin" is the spin of a single electron, or the spin of a single hole, or may be the composite spin of two or more electrons or holes, for qubits utilising two or more electrons or holes.

The above embodiments describe qubits formed by one, two or three quantum dots. Qubits may be formed by four or more quantum dots. The invention is not limited to one, two or three quantum dot qubits.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The claims defining the invention are as follows:

1. A processing element for an advanced processing apparatus, the processing element comprising:
   a layer of silicon material and a layer of dielectric material forming an interface with the layer of silicon material;
   a confining arrangement for confining one or more electrons or holes in the silicon to form a quantum dot; and
   a control arrangement for controlling a quantum property of the quantum dot to operate the quantum dot as a qubit;
   wherein the electrical properties of the layer of dielectric material, the confining arrangement, and the control arrangement are such that the layer of dielectric material, the confining arrangement, and the control arrangement are manufacturable using a complementary metal-oxide-semiconductor transistor manufacturing line.

2. A processing element in accordance with claim 1, wherein the control arrangement comprises a control arranged to tune the quantum dot so that the energy at which the state of the qubit is affected can be adjusted over a range of energy values.

3. A processing element in accordance with claim 1, wherein the quantum property comprises electron or hole spin.

4. A processing element in accordance with claim 1 wherein the confining arrangement is adapted to confine one or more electrons or holes to form a pair of quantum dots and the control arrangement is adapted to control a singlet and triplet state of the pair of quantum dots to encode qubit logic states.

5. A processing element in accordance with claim 1 wherein the confining arrangement is adapted to confine one or more electrons or holes to form at least three quantum dots and the control arrangement is adapted to control spin states of the at least three quantum dots to encode qubit logic states.

6. A processing element in accordance with claim 2 wherein the qubit logic states are controlled by voltages applied to the control arrangement to tune an exchange interaction between spins of electrons or holes in one or more of the quantum dots.

7. A processing element in accordance with claim 2, the control comprising a gate electrode arranged to have a voltage applied to tune the electron or hole spin resonance frequency.

8. A processing element in accordance with claim 7, wherein the control arrangement is arranged to apply a signal at the frequency to which the ESR of the qubit is tuned.

9. A processing element in accordance with claim 8, wherein the control arrangement comprises a transmission line integrated with the Si material in proximity to the quantum dot, so as to be able to affect the spin of the electron or hole.

10. A processing element in accordance with claim 8, wherein the control arrangement comprises a generator for bathing the processing element in electromagnetic radiation for affecting the spin of the electron or hole.

11. A processing element in accordance with claim 7, comprising a read out arrangement for reading the state of the qubit; the read out arrangement comprising a single electron transistor (SET) or a quantum point contact (QPC) arranged to detect an electron or hole tunneling event and an electrode capacitively coupled to the processing element.

12. A processing element in accordance with claim 1, wherein the confining arrangement comprises one or more gate electrodes arranged to have a voltage applied to produce an electrostatic field to confine electrons or holes to form the quantum dot.

13. An advanced processing apparatus, comprising a plurality of processing elements in accordance with claim 1, arranged in an array within a Si substrate.

14. An advanced processing apparatus in accordance with claim 13, comprising an exchange control arrangement for controlling an exchange interaction between a plurality of processing elements, to implement quantum processing.

15. An advanced processing apparatus in accordance with claim 13, wherein the control arrangement comprises a control arranged to tune the quantum dot so that the energy at which the state of the qubit is affected can be adjusted over a range of energy values, and wherein the control arrangement is implemented in the advanced processing apparatus by one or more control lines which are arranged to interact with the plurality of processing elements in a manner such that each processing element is individually addressable or the processing elements are addressable in groups.

16. A method of operation of a quantum processing element, the processing element comprising;
   a layer of silicon material and a layer of dielectric material forming an interface with the layer of silicon material;
   a confining arrangement for confining one or more electrons or holes in the silicon to form a quantum dot; and
   a control arrangement for controlling a quantum property of the quantum dot to operate the quantum dot as a qubit;
   wherein the electrical properties of the layer of dielectric material, the confining arrangement, and the control arrangement are such that the layer of dielectric material, the confining arrangement, and the control arrangement are manufacturable using a complementary metal-oxide-semiconductor transistor manufacturing line; and
   wherein the method comprises the step of applying a signal via the control arrangement to control the status of the qubit.

17. A method in accordance with claim 16, comprising the further step of applying a further control signal to tune the quantum dot so the energy at which the state of the qubit is affected is adjusted to an energy value from a range of available energy values.

18. A method in accordance with claim 16 wherein the confining arrangement is arranged to confine one or more electrons or holes to form a pair of quantum dots and the control arrangement is arranged to control a singlet and triplet state of the pair of quantum dots to encode qubit logic states, the method comprising the step of applying a signal via the control arrangement to control the state of the qubit.

19. A method in accordance with claim 16 comprising the step of applying voltage signals to the control arrangement to control the qubit logic states by tuning an exchange interaction between spins of electrons or holes in one or more of the quantum dots.

20. A method of implementing a quantum processing element, comprising the steps of applying an electric field to form a quantum dot at an interface between silicon and a dielectric, and applying an electromagnetic field to affect a quantum state of the quantum dot.

21. A method in accordance with claim 20, comprising the step of applying a further electromagnetic field to tune the quantum dot so the energy at which the state of quantum dot is affected is adjusted to an energy value from a range of available energy values.

* * * * *